US012672252B2

(12) United States Patent (10) Patent No.: US 12,672,252 B2
Melzer et al. (45) Date of Patent: Jun. 30, 2026

(54) AUTOMATION PLATFORM

(71) Applicant: Beckhoff Automation GmbH, Verl (DE)

(72) Inventors: Udo Melzer, Gütersloh (DE); Daniel Siegenbrink, Bielefeld (DE)

(73) Assignee: Beckhoff Automation GmbH, Verl (DE)

( * ) Notice: Subject to any disclaimer, the term of this patent is extended or adjusted under 35 U.S.C. 154(b) by 63 days.

(21) Appl. No.: 18/950,419

(22) Filed: Nov. 18, 2024

(65) Prior Publication Data

US 2025/0081377 A1 Mar. 6, 2025

Related U.S. Application Data

(63) Continuation of application No. PCT/EP2023/063919, filed on May 24, 2023.

(30) Foreign Application Priority Data

May 25, 2022 (DE) ..................... 10 2022 113 306.0

(51) Int. Cl.
 *H05K 7/14* (2006.01)
 *H05K 5/06* (2006.01)
(52) U.S. Cl.
 CPC ........... *H05K 7/1465* (2013.01); *H05K 5/061* (2013.01); *H05K 7/1468* (2013.01); *H05K 7/1474* (2013.01)
(58) Field of Classification Search
 None
 See application file for complete search history.

(56) References Cited

U.S. PATENT DOCUMENTS 7,616,453 B2 11/2009 Bergmann
8,681,508 B2 3/2014 Fuke et al.
(Continued)

FOREIGN PATENT DOCUMENTS

DE 10230292 B3 1/2004
DE 102015006823 A1 12/2016
(Continued)

OTHER PUBLICATIONS

Examination Report dated May 25, 2023 in connection with German patent application No. 102022113306.0, 8 pages including English translation.

(Continued)

*Primary Examiner* — Xanthia C Relford
(74) *Attorney, Agent, or Firm* — Dorsey & Whitney LLP

(57) ABSTRACT

A base module has a base connection surface with a projection formed around a first opening. A functional module has an engagement element arranged at a second opening having a recess with an edge forming a stop. A sealing socket runs around the second opening. A cap structure includes a frame running around the second opening, a plug-in receptacle connected to the frame and having a latching hook, and a soft component arranged on the frame facing the functional connection surface. The engagement element can be inserted into the plug-in receptacle with the soft component resting against the sealing socket and the latching hook engaged in the recess. A connecting device is provided between the modules. When the connecting device is open, the latching hook makes contact with the stop and the sealing socket is supported on the soft component with the connection surfaces spaced apart. When the connecting device is closed, the connecting surfaces are pressed against each with the soft component between the projection and the sealing socket, and the engagement element pushed into the (Continued)

plug-in receptacle with the latching hook at a distance from the stop.

18 Claims, 9 Drawing Sheets

(56) References Cited

U.S. PATENT DOCUMENTS

| | | | | |
|---|---|---|---|---|
| 9,564,707 | B2 * | 2/2017 | Geitner | H05K 7/1478 |
| 10,104,791 | B2 | 10/2018 | Spaeh | |
| 10,528,510 | B2 * | 1/2020 | Hampikian | G06F 13/36 |
| 11,956,915 | B2 | 4/2024 | Beckhoff et al. | |
| 12,245,398 | B2 * | 3/2025 | Beckhoff | H05K 7/202 |
| 2007/0066147 | A1 * | 3/2007 | Braunlich | H05K 7/1465 |
| | | | | 439/717 |
| 2012/0327619 | A1 * | 12/2012 | Herkenrath | H05K 7/1468 |
| | | | | 361/759 |
| 2014/0307367 | A1 * | 10/2014 | Maeda | H05K 7/14324 |
| | | | | 361/640 |
| 2015/0195944 | A1 | 7/2015 | Bury et al. | |
| 2018/0069359 | A1 * | 3/2018 | Müller | H01R 9/2658 |
| 2020/0280177 | A1 * | 9/2020 | Budde | H01R 9/2675 |
| 2022/0256731 | A1 * | 8/2022 | Gurlt | H05K 7/2039 |
| 2023/0142990 | A1 * | 5/2023 | Beckhoff | H05K 7/20145 |
| | | | | 361/696 |

FOREIGN PATENT DOCUMENTS

| | | | |
|---|---|---|---|
| DE | 102019106082 | A1 | 9/2020 |
| EP | 1587352 | A2 | 10/2005 |
| JP | 2005116872 | A | 4/2005 |
| JP | 2006075303 | A | 3/2006 |
| JP | 2012074506 | A | 4/2012 |
| JP | 2022522527 | A | 4/2022 |
| WO | 2016030005 | A1 | 3/2016 |
| WO | 2020182877 | A1 | 9/2020 |

OTHER PUBLICATIONS

International Search Report and Written Opinion dated Sep. 19, 2023 in connection with International Patent Application No. PCT/EP2023/063919, 38 pages including English translation.
Decision to Grant dated Mar. 3, 2026 in connection with Japanese patent application No. 2024-569114, 4 pages including English translation.

* cited by examiner

AUTOMATION PLATFORM

CROSS-REFERENCE TO RELATED APPLICATIONS

The present patent application is a continuation of International Patent Application No. PCT/EP2023/063919, filed May 24, 2023, which claims the priority of German patent application DE 10 2022 113 306.0 filed May 25, 2022, "Automatisierungsplattform," the contents of each of which are incorporated by reference herein, in the entirety and for all purposes.

FIELD

The present invention relates to an automation platform.

BACKGROUND

Modular automation platforms having a base module and a number of functional modules are known from the state of the art. In order to protect an automation platform from moisture and/or dust, seals are used between the functional modules and the base module.

SUMMARY

The invention provides an improved an improved automation platform and an improved functional module for an automation platform and to provide an improved method for assembling an automation platform.

According to an aspect, an automation platform having a base module, at least one functional module and at least one connecting device for connecting the base module and the functional module, wherein the base module comprises a base housing having a base housing connection surface, wherein the base housing connection surface comprises at least one first opening, wherein a projection running around the first opening is embodied in the base housing connection surface.

The functional module comprises a functional housing having a functional housing connection surface, wherein the functional housing connection surface comprises at least one second opening, at least one engagement element arranged at the second opening and a sealing socket running around the second opening, wherein a wall of the engagement element comprises a recess, wherein an edge of the wall of the engagement element delimiting the recess forms a stop on a side of the recess facing away from the functional housing connection surface. The functional module comprises a cap structure having a hard component and a soft component arranged on the hard component, wherein the hard component comprises a frame running around the second opening and at least one plug-in receptacle connected to the frame, wherein the soft component of the cap structure is arranged on a side of the frame facing the functional housing connection surface and runs laterally around the second opening, wherein a latching hook is arranged at a wall of the plug-in receptacle, wherein the engagement element is inserted into the plug-in receptacle in such a way that the soft component bears against an outer wall of the sealing socket and the latching hook engages in the recess.

When the functional module is placed onto the base module, with the connecting device open, the soft component of the cap structure arranges the hard component of the cap structure at the functional housing connection surface in such a way that the latching hook of the plug-in receptacle abuts on the stop of the engagement element, the cap structure engages in the first opening in the base housing connection surface in such a way that the frame of the hard component of the cap structure rests on the projection in the base housing connection surface and the outer wall of the sealing socket is supported on the soft component of the cap structure in such a way that the functional housing connection surface is spaced apart from the base housing connection surface. When the connecting device is closed, the functional housing connecting surface is pressed against the base housing connecting surface in such a way that the soft component of the cap structure is radially pressed in regions between the projection in the base housing connection surface and the outer wall of the sealing socket and the engagement element of the functional housing connection surface is inserted into the plug-in receptacle of the hard component of the cap structure in such a way that the latching hook of the plug-in receptacle is spaced apart from the stop of the engagement element.

According to another aspect, a functional module comprises a functional housing with a functional housing connection surface, wherein the functional housing connection surface comprises at least one second opening, at least one engagement element arranged at the second opening and a scaling socket running around the second opening, wherein a wall of the engagement element comprises a recess, wherein an edge of the wall of the engagement element delimiting the recess forms a stop on a side of the recess facing away from the functional housing connection surface.

The functional module comprises a cap structure with a hard component and a soft component arranged on the hard component, wherein the hard component comprises a frame running around the second opening and at least one plug-in receptacle connected to the frame, wherein the soft component of the cap structure is arranged on a side of the frame facing the functional housing connection surface and runs laterally around the second opening, wherein a latching hook is arranged on a wall of the plug-in receptacle, wherein the engagement element is inserted into the plug-in receptacle in such a way that the soft component rests against an outer wall of the sealing socket and the latching hook engages in the recess, wherein the soft component of the cap structure arranges the hard component of the cap structure at the functional housing connection surface in such a way that the latching hook of the plug-in receptacle abuts on the stop of the engagement element.

The functional module may be placed onto a base module in such a way that, when the connecting device is open, the cap structure engages in a first opening in a base housing connection surface, that the frame of the hard component of the cap structure rests on the projection in the base housing connection surface and the outer wall of the sealing socket is supported on the soft component of the cap structure in such a way that the functional housing connection surface is spaced apart from the base housing connection surface. When the connecting device is closed, the functional housing connecting surface is pressed against the base housing connecting surface in such a way that the soft component of the cap structure is radially pressed in regions between the projection in the base housing connection surface and the outer wall of the sealing socket and the engagement element of the functional housing connection surface is pushed into the plug-in receptacle of the hard component of the cap structure in such a way that the latching hook of the plug-in receptacle is spaced apart from the stop of the engagement element.

According to another aspect, a method for assembling an automation platform comprises the following method steps:

Placing a functional module onto a base module in such a way that a cap structure engages in a first opening in a base housing connection surface, that a frame of a hard component of the cap structure rests on a projection in the base housing connection surface an outer wall of a sealing socket are supported on a soft component of the cap structure in such a way that a functional housing connection surface is spaced apart from the base housing connection surface.

Closing a connecting device, wherein the functional housing connection surface is pressed against the base housing connection surface in such a way that the soft component of the cap structure is radially pressed in regions between the projection in the base housing connection surface and the outer wall of the sealing socket, and an engagement element of the functional housing connection surface is inserted into a plug-in receptacle of the hard component of the cap structure in such a way that a latching hook of the plug-in receptacle is spaced apart from a stop of the engagement element.

EXAMPLES

An automation platform comprises a base module, at least one functional module and at least one connecting device for connecting the base module and the functional module. The base module comprises a base housing having a base housing connection surface. The base housing connection surface comprising at least one first opening. A projection surrounding the first opening is formed in the base housing connection surface. The functional module comprises a functional housing having a functional housing connection surface. The functional housing connection surface comprises at least one second opening, at least one engagement element arranged at the second opening and a sealing socket running around the second opening. One wall of the engagement element comprises a recess. An edge of the wall of the engagement element defining the recess forms a stop on a side of the recess facing away from the functional housing connection surface.

The functional module comprises a cap structure with a hard component and a soft component arranged on the hard component. The hard component comprises a frame running around the second opening and at least one plug-in receptacle connected to the frame. The soft component of the cap structure is arranged on a side of the frame facing the functional housing connection surface and runs laterally around the second opening. A latching hook is arranged on one wall of the plug-in receptacle. The engagement element is pushed into the plug-in receptacle in such a way that the soft component rests against an outer wall of the sealing socket and the latching hook engages in the recess.

When the functional module is placed onto the base module, with the connecting device open, the soft component of the cap structure arranges the hard component of the cap structure on the functional housing connection surface in such a way that the latching hook of the plug-in receptacle abuts on the stop of the engagement element and the cap structure engages in the first opening in the base housing connection surface, that the frame of the hard component of the cap structure rests on the projection in the base housing connection surface and the outer wall of the sealing socket is supported on the soft component of the cap structure in such a way that the functional housing connection surface is spaced apart from the base housing connection surface.

When the connecting device is closed, the functional housing connection surface is pressed against the base housing connection surface in such a way that the soft component of the cap structure is radially pressed in areas between the projection in the base housing connection surface and the outer wall of the sealing socket and the engagement element of the functional housing connection surface is pushed into the plug-in receptacle of the hard component of the cap structure in such a way that the latching hook of the plug-in receptacle is spaced apart from the stop of the engagement element.

The soft component pressed in the area between the projection in the base housing connection surface and the sealing socket advantageously embodies a radial seal or a radial barrier against the ingress of dust, moisture or chemicals. One advantage of the radial seal is that the radial seal is at first not yet pressed when the functional module is placed onto the base module. If the frame of the cap structure is in contact with the projection in the base housing connection surface and the functional module has not yet been pressed onto the base module using the connecting device, the soft component is in a non-pressed state. As a result, the functional housing connection surface is initially at a distance from the base housing connection surface. This means that the functional module may be fitted with particularly little force, as the frictional force is reduced when fitting the functional module. This means that large functional modules with a number of radial seals may particularly be fitted onto the base module with little forces involved. When the functional module is fitted, the latching hook of the plug-in receptacle strikes the stop of the engagement element.

Only when the connecting device is closed is the soft component pressed into place, creating a sealing effect of the radial seal. In this case, the cap structure is pushed into the base housing by the distance or stroke remaining between the functional housing connection surface and the base housing connection surface after the functional module has been fitted. This distances the latching hook from the stop.

When the connecting device is released, the soft component presses against the functional module until the soft component has expanded to its unpressed form so that the stroke between the functional module and base module is restored. This makes it easier to remove the functional module. After releasing the connecting device, the latching hook strikes the stop again, wherein the cap structure is taken along when the functional module is removed. All in all, this simplifies both the assembling of the functional module on the base module and its removal. The frictional forces are reduced in both cases, which has the advantage of reducing wear on the radial seal.

In an embodiment, the functional housing connection surface comprises at least one further engagement element arranged opposite to the second opening and the engagement element. A wall of the further engagement element comprises a further recess. A further edge of the wall of the further engagement element delimiting the further recess forms a further stop on a side of the further recess facing away from the functional housing connection surface. The hard component comprises at least one further plug-in receptacle connected to the frame. A further latching hook is arranged on one wall of the further plug-in receptacle. The further engagement element is pushed into the further plug-in receptacle in such a way that the soft component rests against an outer wall of the sealing socket and the further latching hook engages in the further recess.

When the functional module is placed onto the base module, with the connecting device open, the soft component of the cap structure arranges the hard component of the cap structure on the functional housing connection surface in such a way that the further latching hook of the further plug-in receptacle abuts on the further stop of the further engagement element. When the connecting device is closed, the further engagement element of the functional housing connection surface is pushed into the further plug-in receptacle of the hard component of the cap structure in such a way that the further latching hook of the further plug-in receptacle is at a distance from the further stop of the further engagement element.

Advantageously, the radial seal is pressed more evenly if the functional housing connection surface comprises at least the further engagement element and the cap structure comprises the further plug-in receptacle, since the cap structure is plugged onto the engagement elements on opposite sides. The fact that at least two latching hooks are connected to the functional housing connection surface allows for evenly removing the functional module, as the cap structure may be taken along on at least two opposite sides of the second opening when the functional module is separated from the base module.

In an embodiment, the sealing socket is tapered at least in sections from the functional housing connection surface. The soft component of the cap structure lies against the outer wall of the sealing socket in the area of the tapered section. Advantageously, the radial seal is pressed more efficiently by a tapered sealing socket.

In an embodiment, the sealing socket is connected to the engagement element and is formed by the engagement element in the area of the engagement element or runs laterally around the engagement element.

In an embodiment, an additional soft component is arranged between the functional housing connection surface and the side walls of the functional housing. When the functional module is placed onto the base module, with the connecting device open, the additional soft component is arranged on the base housing connection surface and is pressed against the base housing connection surface when the connecting device is closed. Advantageously, the additional soft component forms an axial seal or an axial barrier against the ingress of dust, moisture or chemicals. In addition, a radial barrier is formed in the area between the side walls of the functional housing and the functional housing connection surface.

In an embodiment, the side walls of the functional housing comprise a further projection on the inside of the functional housing. When the functional module is placed onto the base module with the connecting device open, the additional soft component lies against the additional projection and is pressed against the additional projection when the connecting device is closed. Advantageously, the additional soft component forms an axial seal or an axial barrier.

In an embodiment, the functional housing connection surface comprises an additional projection protruding in the direction of the side walls of the functional housing. The additional projection is embedded in the additional soft component. When the functional module is placed onto the base module, with the connecting device open, the additional soft component lies against the additional projection and is pressed against the additional projection when the connecting device is closed. Advantageously, the additional projection forms both an axial seal or an axial barrier and a radial seal or radial barrier. The axial barrier is formed on a side of the functional housing connection surface facing the base housing connection surface and in the area of the additional projection. The radial barrier is formed on an edge of the functional housing connection surface.

In an embodiment, the functional housing connection surface is rigidly connected to the side walls of the functional housing. A further soft component is arranged in a groove formed on the functional housing connection surface. When the functional module is placed onto the base module, with the connecting device open, the additional soft component is arranged on the base housing connection surface and is pressed against the base housing connection surface when the connecting device is closed. Advantageously, the additional soft component forms an axial seal or an axial barrier.

A functional module for an automation platform comprises a functional housing with a functional housing connection surface. The functional housing connection surface comprises at least one second opening, at least one engagement element arranged at the second opening and a sealing socket running around the second opening. One wall of the engagement element comprises a recess. An edge of the wall of the engagement element defining the recess forms a stop on a side of the recess facing away from the functional housing connection surface.

The functional module comprises a cap structure with a hard component and a soft component arranged on the hard component. The hard component comprises a frame running around the second opening and at least one plug-in receptacle connected to the frame. The soft component of the cap structure is arranged on a side of the frame facing the functional housing connection surface and runs laterally around the second opening. A latching hook is arranged on one wall of the plug-in receptacle. The engagement element is inserted into the plug-in receptacle in such a way that the soft component rests against an outer wall of the sealing socket and the latching hook engages in the recess. The soft component of the cap structure arranges the hard component of the cap structure on the functional housing connection surface in such a way that the latching hook of the plug-in receptacle makes contact with the stop of the engagement element.

The functional module may be placed onto the base module in such a way that when the connecting device is open, the cap structure engages in the first opening in the base housing connection surface in such a way that the frame of the hard component of the cap structure rests on the projection in the base housing connection surface and the outer wall of the sealing socket is supported on the soft component of the cap structure in such a way that the functional housing connection surface is spaced apart from the base housing connection surface.

When the connecting device is closed, the functional housing connection surface is pressed against the base housing connection surface in such a way that the soft component of the cap structure is radially pressed in areas between the projection in the base housing connection surface and the outer wall of the sealing socket and the engagement element of the functional housing connection surface is pushed into the plug-in receptacle of the hard component of the cap structure in such a way that the latching hook of the plug-in receptacle is spaced apart from the stop of the engagement element.

In an embodiment, the functional housing connection surface comprises at least one further engagement element arranged opposite to the second opening and the engagement element. A wall of the further engagement element comprises a further recess. A further edge of the wall of the further engagement element delimiting the further recess forms a further stop on a side of the further recess facing away from the functional housing connection surface. The hard component comprises at least one further plug-in receptacle connected to the frame. A further latching hook is arranged on one wall of the further plug-in receptacle. The further engagement element is inserted into the further plug-in receptacle in such a way that the soft component rests against an outer wall of the sealing socket and the further latching hook engages in the further recess.

The soft component of the cap structure arranges the hard component of the cap structure on the functional housing connection surface in such a way that the further latching hook of the further plug-in receptacle abuts on the further stop of the further engagement element. When the connecting device is closed, the further engagement element of the functional housing connection surface is pushed into the further plug-in receptacle of the hard component of the cap structure in such a way that the further latching hook of the further plug-in receptacle is at a distance from the further stop of the further engagement element.

In an embodiment, the sealing socket is tapered at least in sections originating from the functional housing connection surface. The soft component of the cap structure lies against the outer wall of the sealing socket in the area of the tapered section.

In an embodiment, the sealing socket is connected to the engagement element and is formed by the engagement element in the area of the engagement element or runs laterally around the engagement element.

In an embodiment, an additional soft component is arranged between the functional housing connection surface and the side walls of the functional housing. When the functional module is placed onto the base module, with the connecting device open, the additional soft component is arranged on the base housing connection surface and pressed against the base housing connection surface when the connecting device is closed.

In an embodiment, the side walls of the functional housing comprise a further projection on the inside of the functional housing. When the functional module is placed onto the base module with the connecting device open, the additional soft component rests against the additional projection and is pressed against the additional projection when the connecting device is closed.

In an embodiment, the functional housing connection surface comprises an additional projection protruding in the direction of the side walls of the functional housing. The additional projection is embedded in the additional soft component.

In an embodiment, the functional housing connection surface is rigidly connected to the side walls of the functional housing. A further soft component is arranged in a groove formed on the functional housing connection surface. When the functional module is placed onto the base module, with the connecting device open, the additional soft component is arranged on the base housing connection surface and pressed against the base housing connection surface when the connecting device is closed.

In a method for assembling an automation platform, the functional module is placed onto the base module in such a way that the cap structure engages the first opening in the base housing connection surface in such a way that the frame of the hard component of the cap structure rests on the projection in the base housing connection surface and the outer walls of the sealing socket are supported on the soft component of the cap structure in such a way that the functional housing connection surface is spaced apart from the base housing connection surface.

The connecting device is closed, wherein the functional housing connection surface is pressed against the base housing connection surface in such a way that the soft component of the cap structure is radially pressed in areas between the projection in the base housing connection surface and the outer wall of the sealing socket, and the engagement element of the functional housing connection surface is pushed into the plug-in receptacle of the hard component of the cap structure in such a way that the latching hook of the plug-in receptacle is spaced apart from the stop of the engagement element.

In an embodiment, the connecting device is released, wherein the soft component presses against the outer wall of the sealing socket in such a way that the functional housing connection surface is spaced apart from the base housing connection surface and the latching hook rests against the stop of the engagement elements.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
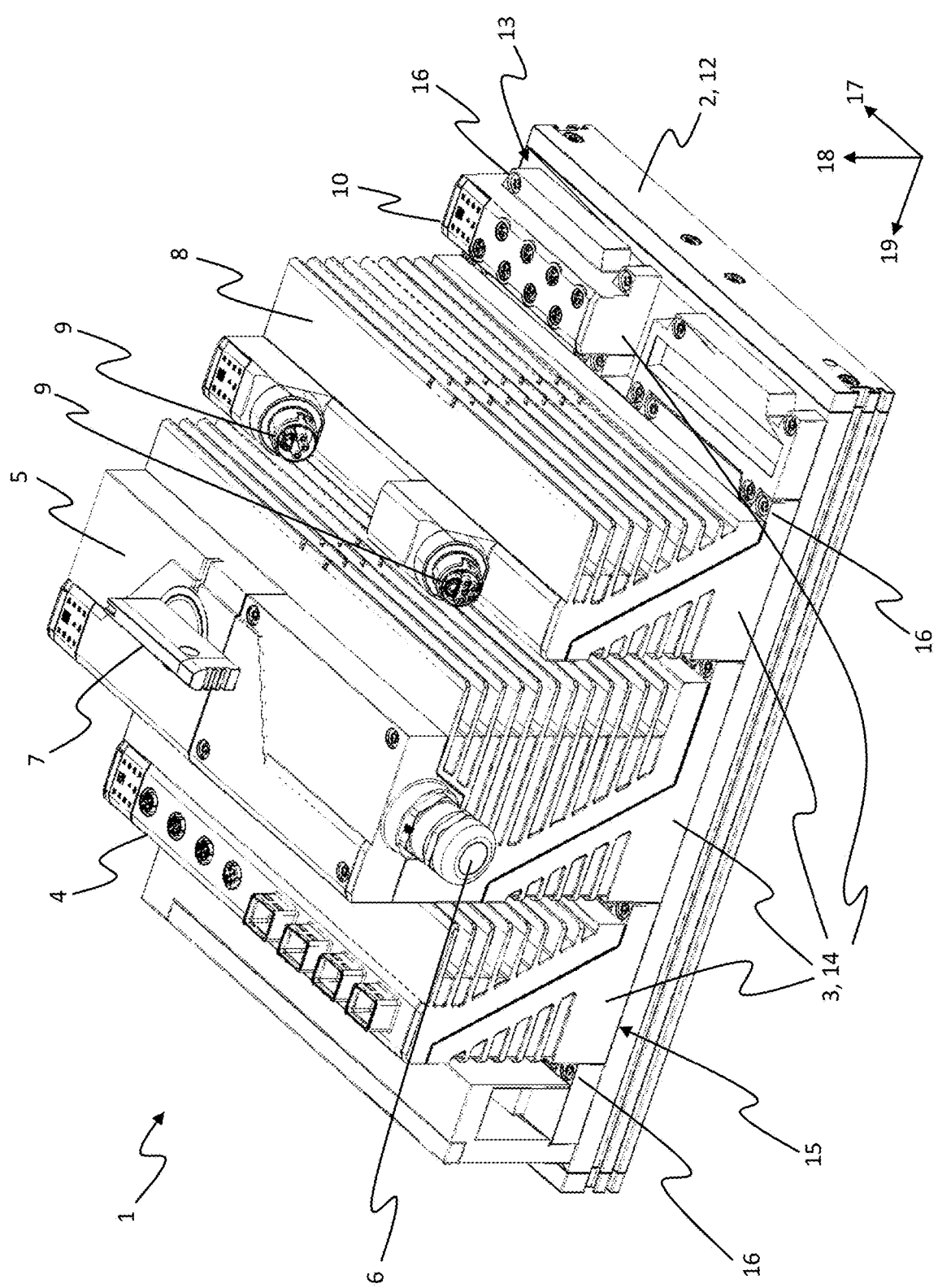
FIG. 1 shows a perspective view of the automation platform having a base module and functional modules.

The figures are merely schematic and not to scale. Furthermore, the reference numerals in the figures are chosen unchanged if they are elements or components of the same embodiment.

In the following, the same reference numerals may be used for the same features. Furthermore, for reasons of clarity, it may be provided that not all elements are shown in each figure. Furthermore, for the sake of clarity, it may be provided that not every element is indicated by its own reference numeral in every drawing.

FIG. 1 shows a schematic perspective view of an exemplary automation platform 1. The automation platform 1 comprises electrical and/or electronic components and serves as a distribution system for field devices such as sensors and actuators. The automation platform 1 may e.g. be used in a production machine. The automation platform 1 may replace a control cabinet.

The automation platform 1 has a modular design. The automation platform 1 comprises a base module 2 and functional modules 3. As an example, the automation platform 1 comprises a total of four functional modules 3. The automation platform 1 may also comprise a different number of functional modules 3, but the automation platform 1 comprises at least one functional module 3. By way of example only, the functional modules 3 are of different sizes.

A first functional module 4 is exemplarily embodied as an industrial PC module. The industrial PC module may also be referred to as a superordinate module and is embodied to control the other functional modules 3.

A second functional module 5 is exemplarily embodied as a system module. The system module comprises a connection 6 for supplying a system voltage, a fuse for protecting the system voltage and a main switch 7 for switching the system voltage.

A third functional module 8 is exemplarily embodied as a bus coupler. The bus coupler comprises two exemplary connections 9, each having a data input and a data output. The data communication may e.g. be based on an Ethernet or EtherCAT protocol. However, data communication is not limited to the protocols mentioned. In addition to the data inputs and data outputs, the connections 9 of the bus coupler may each comprise a voltage input and a voltage output for coupling in and forwarding an electrical voltage. In this case, the data communication and the electrical voltage may each be fed in via a common connection 9, but this is not necessary. Instead, separate voltage connections may be provided for feeding in and forwarding electrical voltages.

Alternatively, the third functional module 8 may also be embodied as a relay module for direct switching of an electrical voltage. For example, a relay module may be used to supply voltage to a fan, an electric heater, lighting and an electric motor, such as a three-phase asynchronous motor. Alternatively, the third functional module 8 may also be embodied as a servo amplifier or frequency converter.

A fourth functional module 10 of the control cabinet system 1 is exemplarily embodied as an I/O module with connections 11 with analog and/or digital data inputs and data outputs. Field devices, such as actuators and/or sensors, may be controlled via the I/O module.

The base module 2 comprises a base housing 12 with a base housing connection surface 13. The functional modules 3 each comprise a functional housing 14 with a functional housing connection surface 15. In the assembled state of the automation platform 1, the functional modules 3 are each arranged with their functional housing connection surfaces 15 on the base housing connection surface 13 and pressed onto the base housing connection surface 13 with the aid of a respective connecting device 16.

The connecting devices 16 are embodied to connect the functional modules 3 to the base module 2. In the exemplary embodiment of the automation platform 1, the connecting devices 16 each comprise a plurality of screws per functional module 3, with the aid of which the functional modules 3 are fixed to the base housing connection surface 13. The screws extend through the functional modules 3. To accommodate the screws, the connecting devices 16 on the base housing connection surface 13 each comprise blind holes having a thread, for example. The connecting devices 16 may also be embodied differently. For example, the connecting devices 16 may be embodied in the form of latching structures, allowing the functional modules 3 to be arranged on the base housing connection surface 13 in a latching manner.

Figure 2:
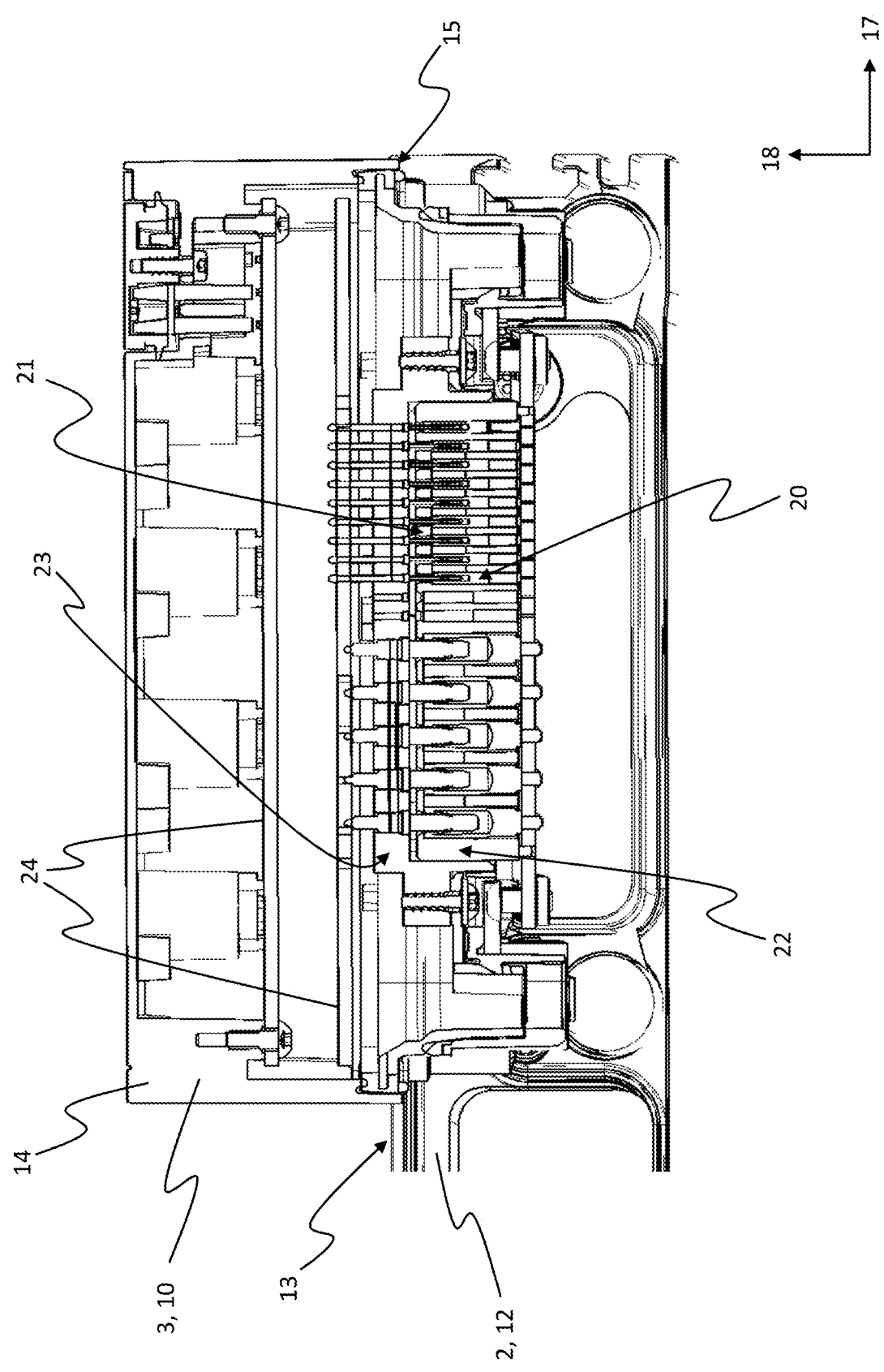
FIG. 2 shows a cross-sectional view of the automation platform of FIG. 1.

FIG. 2 schematically shows a cross-sectional view of the automation platform 1 of FIG. 1 along a plane spanned by a first direction 17 and a second direction 18, extending along a functional module 3 and running perpendicular with regard to the base housing connection surface 13. A cross-section through the fourth functional module 10 is shown by way of example only. However, the following description applies accordingly to all functional modules 3. Identical elements are marked by the same reference numerals as in FIG. 1.

The base module 2 is intended to receive data from the functional modules 3 and transmit it to the functional modules 3. For this purpose, the base module 2 comprises base connection elements 20 arranged in the base housing 12. The functional modules 3 each comprise functional connection elements 21 arranged in the functional housings 14. In the assembled state of the automation platform 1, one base connection element 20 and one functional connection element 21 engage with each other and form interfaces between the base module 2 and the functional modules 3. Data may be exchanged between the base module 2 and the fourth functional module 10 via the interface. Electrical voltages may also be provided to the fourth functional module 10 by the base module 2.

The base housing 12 comprises first openings 22 on the base housing connection surface 13. The first openings 22 are each arranged in areas of the base connection elements 20. In each case, a base connection element 20 and a first opening 22 form a slot for a functional module 3. The base connection elements 20 may be embodied either as built-in plugs or as built-in sockets. As an example, the base connection elements 20 of FIG. 2 are embodied as built-in sockets. Any number of contact openings of the base connection elements 20 may be used.

The functional housing 14 of the fourth functional module 10 comprises a second opening 23 on its functional housing connection surface 15. In the assembled state of the automation platform 1, when the functional housing 14 rests with the functional housing connection surface 15 against the base housing connection surface 13 of the base housing 12, the first opening 22 and the second opening 23 are arranged on top of one another. The functional connection element 21 is arranged in the area of the second opening 23 and protrudes from the functional housing 14. The functional connection elements 21 may be embodied either as built-in plugs or as built-in sockets. As an example, the functional connection element 21 of the fourth functional module 10 is embodied as a built-in plug. Any number of contact pins of the functional connection elements 21 may be used.

A functional housing 14 may comprise any number of second openings 23 and functional connection elements 21 arranged in areas of the second openings 23. For example, the second functional module 5 of FIG. 1 extends over a total of six slots of the base module 2. The second functional module 5 also comprises, by way of example, only four second openings 23 and two functional connection elements 21. No second openings 23 are provided in the second functional module 5 for two first openings 22 of the base module 2.

On the other hand, no functional connection elements 21 are provided for two of the four second openings 23. In contrast, the first functional module 4 and the third functional module 8 each extend over four slots of the base module 2, for example, and each comprise two functional connection elements 21 arranged in the area of one of two first openings 23. Second openings 23, in which no functional connection element 21 is arranged, may be used to ventilate the second functional module 5 or any functional module 3 and may also serve to guide the functional module 3 during assembly.

If a functional module 3 extends over a plurality of slots or first openings 22 of the base module 2 and comprises a smaller number of second openings 23 and/or functional connection elements 21, slots of the base module may be omitted, i.e. at least base connection elements 20 and possibly also first openings 22 may be omitted. For example, in the case of the second functional module 5, a total of four slots of the base module 2 may be omitted. Instead of omitting a first opening 22 if no base connection element 20 is provided, the first opening 22 may also be sealed by a plug 57.

Such a plug 57 may, for example, be made of a solid material with a circumferential groove and an O-ring seal arranged in the circumferential groove. The plug 57 may also enclose a base connection element 20 of a slot. The plugs 57 may be inserted into unused slots of the base module 2 before assembling the functional modules 3 in order to seal them. The aforementioned O-ring seal is compressed radially by positive locking with the base housing 12. The functional housing connection surface 15 of a mounted functional module 3 may be spaced apart from a plug 57 or rest on the plug 57 and optionally exert pressure on the plug 57 in the mounted state.

For data exchange with the functional modules 3, the base module 2 may comprise interface units in the base housing 12, which may be connected to one another via a data bus. The interface units for the sake of clarity may be embodied as application-specific integrated circuits (ASICs), for example. The connection units may, for example, be part of a circuit board of the base module 2. For communication with the functional modules 3, the interface units are each connected to the base connection elements 20. The functional connection elements 21 of the functional modules 3 are in turn connected to components that are arranged in the functional housings 14. These may be circuit boards 24, for example.

Figure 3:
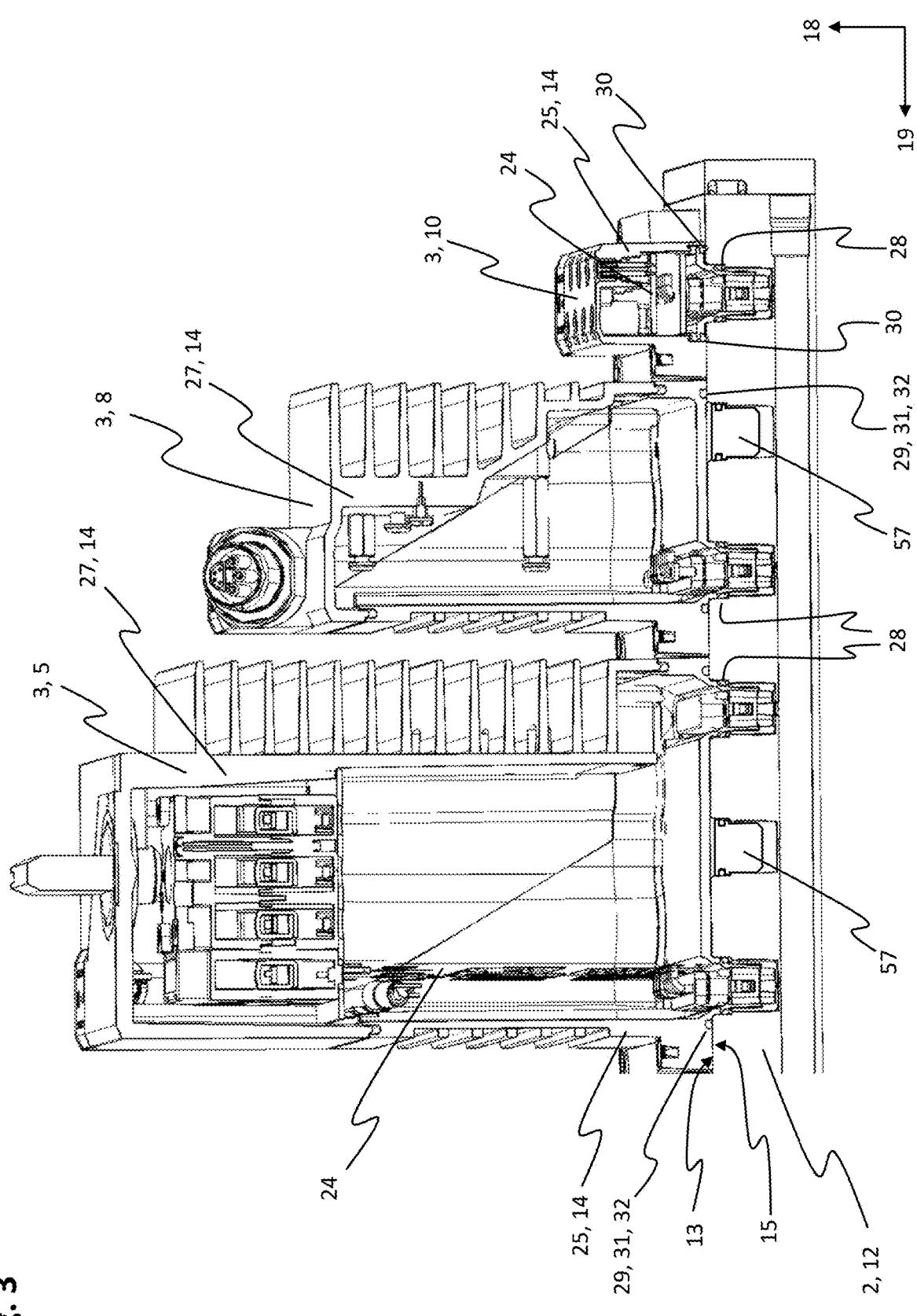
FIG. 3 shows a further cross-sectional view of the automation platform in FIG. 1.

FIG. 3 schematically shows a cross-sectional view of the automation platform 1 of FIG. 1 along a plane spanned by the second direction 18 and a third direction 19 and extending perpendicular with regard to the base housing connection surface 13 and perpendicular with regard to the first direction 17. A cross-section through the second functional module 5, the third functional module 8 and the fourth functional module 10 is shown by way of example only. Identical elements are marked with the same reference numerals as in FIG. 1 and FIG. 2.

The functional modules 3 comprise different types of functional housing 14. The second functional module 5 and the third functional module 8 each comprise a functional housing 14 in which the functional housing connection surface 15 is rigidly connected to side walls 25 of the functional housing 14. This also applies to the first functional module 4. In contrast, the functional housing connection surface 15 of the fourth functional module 10 is not rigidly connected to the side walls of the functional housing 14. Instead, the functional housing connection surface 15 of the fourth functional module 10 is embodied as a separate base plate 26. Conversely, it is also possible for the first functional module 4, the second functional module 5 and the third functional module 8 to each comprise a separate base plate 26 and for the functional housing connection surface

15 of the fourth functional module 10 to be rigidly connected to the side walls 26 of the functional housing 14.

In the variant of the functional housing 14 with a functional housing connection surface 15 rigidly connected to the side walls 25, the functional housings 14 each comprise a cap 27. A cap 27 makes it possible to access an area inside of the functional housing 14, for example to arrange or replace components in the functional housing 14 by opening the cap 27. By way of example only, the functional housings 14 of the second functional module 5 and the third functional module 8 are embodied in such a way that the sections of the side walls 25 rigidly connected to the functional housing connection surface 15 and the cap 27 may each be separated from one another at an angle and essentially along opposing side diagonals of the functional housing 14, which may also be seen in FIG. 1. In the variant with separate base plate 26, the functional housing 14 is accessible because the base plate 26 may be removed.

The automation platform 1 is based on the idea of an improved sealing concept, which is explained in more detail below. The automation platform 1 must be protected against the ingress of dust, moisture or chemicals, for example. For this purpose, the automation system 1 comprises radial seals 28 arranged between the functional modules 3 and the base modules 2. The radial seal 28 is embodied identically for each type of functional module 4, 5, 8, 10.

The automation platform 1 also comprises first axial seals 29 and second axial seals 30. The first, second and third functional modules 4, 5, 8 each comprise a functional housing connection surface 15 rigidly connected to the side walls 25 of the functional housing 14. In each of these cases, a first soft component 31 is arranged in a groove 32 formed on the functional housing connection surface 15. When the first, second and third functional modules 4, 5, 6 are placed onto the base module 2 and the connecting devices 16 are open, the first soft component 31 is arranged on the base housing connection surface 13. When the connecting devices 16 are closed, the first soft components 31 are each pressed against the base housing connection surface 13 and form a first axial barrier against dust, moisture or chemicals between the base housing connection surface 13 and the functional housing connection surface 15.

Figure 4:
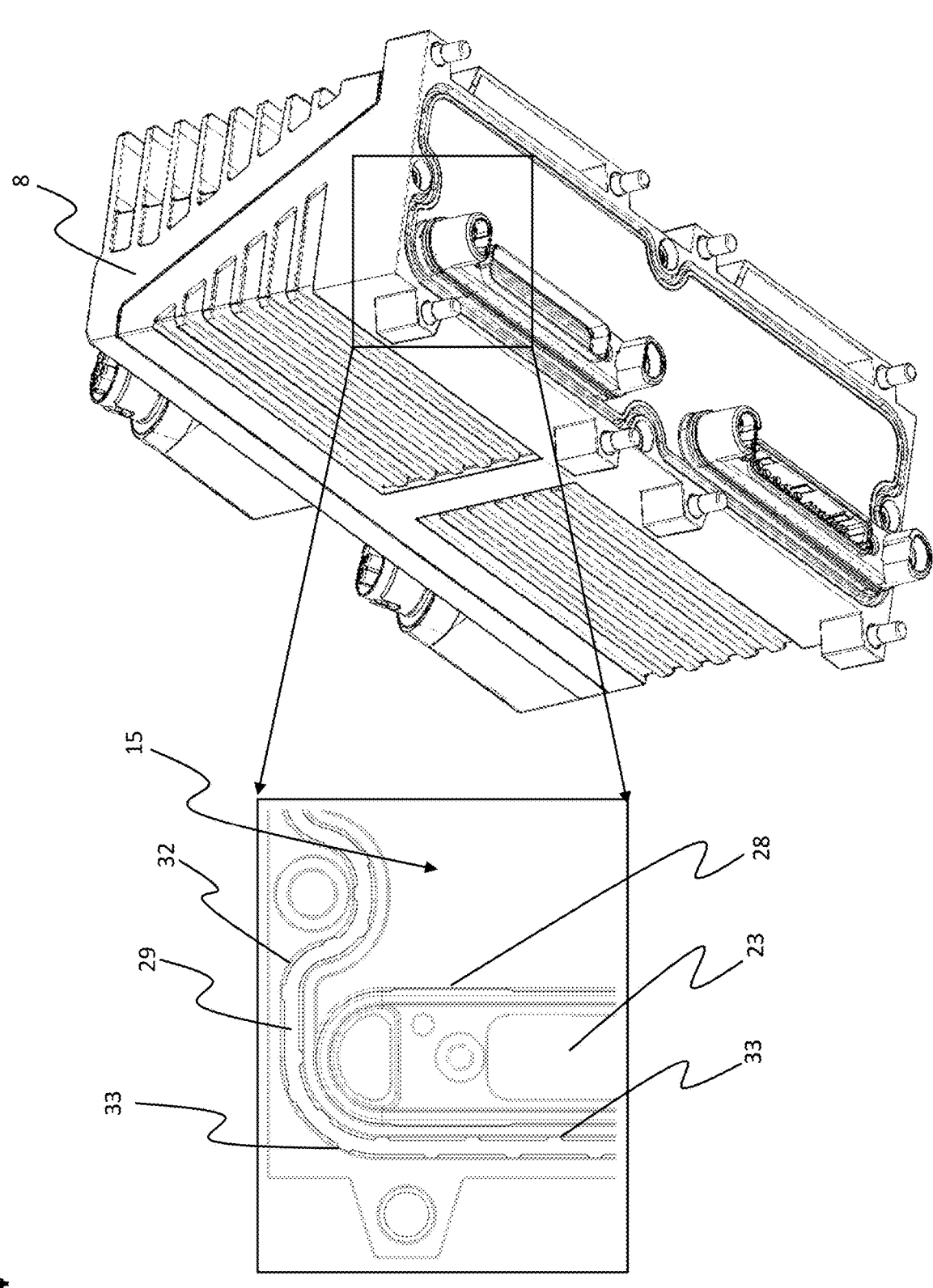
FIG. 4 shows a perspective view of a functional module of the automation platform.

FIG. 4 schematically shows a perspective view of the third functional module 8. Only the third functional module 8 is shown as an example. However, the following description applies accordingly to all functional modules 3 with a first axial seal 29. FIG. 4 also shows an enlargement of a section of the functional housing connection surface 15 with the first axial seal 29. Identical elements are identified by the same reference numerals as in the drawings described above.

The first soft component 31 arranged in the groove 32 is exemplarily embodied as an O-ring. Alternatively, the first soft component 31 may also be arranged in the groove 32 with the aid of a molding process, for example with the aid of an injection molding process. The groove 32 and the first soft component 31 laterally surround the second openings 23 in the functional housing connection surface 15. Likewise, the groove 32 and the first soft component 31 laterally encircle all functional connection elements 21 and all radial seals 28.

The first axial seal 29 comprises retaining nubs 33 for improved fixation of the first soft component 31 within the groove 32. The retaining nubs 33 are formed by the first soft component 31. The retaining nubs 33 are exemplarily arranged in an alternating manner on opposite sides of the first soft component 31, but they may also be arranged differently. However, the retaining nubs 33 may also be omitted.

Figure 5:
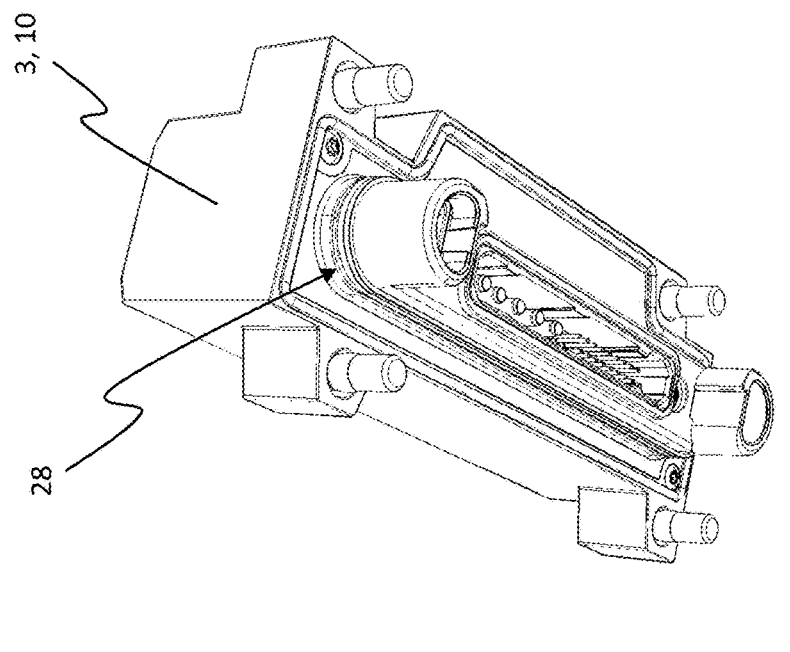
FIG. 5 shows a perspective view of a further functional module of the automation platform.
Figure 5:
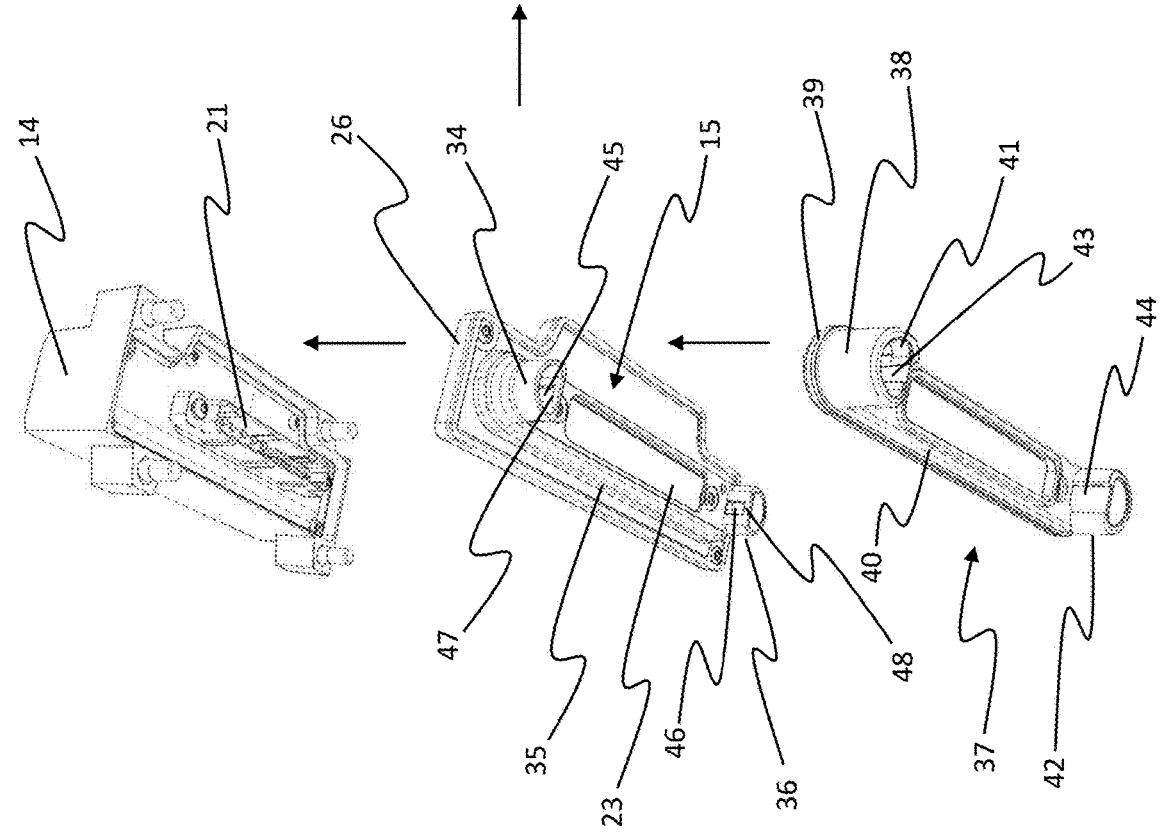

FIG. 5 schematically shows the fourth functional module 10 in a perspective view, wherein the fourth functional module 10 is shown both in a mounted state and in a non-mounted state. FIG. 5 only shows the fourth functional module 10 as an example to explain the radial seals 28 of the automation platform 1. For this reason, the following description applies to all functional modules 3 and their radial seals 28 to the base module 2. Identical elements are identified with the same reference numerals as in the previously explained drawings.

The functional housing connection surface 15 comprises at least one engagement element 34 arranged at the second opening 23 and a sealing socket 35 running around the second opening 23. In the exemplary embodiment of the functional housing 14 of FIG. 5, the functional housing connection surface 15 comprises at least one further engagement element 36 arranged opposite the second opening 23 and the engagement element 34. However, the functional housing connection surface 15 may also comprise any number of engagement elements 34, 36, which are arranged at the second opening 23. However, at least one engagement element 34, 36 is provided for each second opening 23. If the functional housing connection surface 15 of a functional module 3 comprises a plurality of second openings 23, at least one engagement element 34 is arranged at a second opening 23 in each case.

The engagement elements 34, 36 are e.g. cylindrical in shape. The engagement elements 34, 36 are open on a side facing away from the functional housing connection surface 15, making the functional housing 14 accessible. This allows cooling air to be exchanged between the interior of the base housing 14 and the interior of the functional housing 14. For this reason, the engagement elements 34, 36 may also be referred to as ventilation nozzles. However, the engagement elements 34, 36 do not necessarily comprise to be open and embodied as ventilation nozzles. The engagement elements 34, 36 may also comprise a different shape. What is relevant is that the engagement elements 34, 36 project away from the functional housing 14 at the functional housing connection surface 15.

The sealing socket 35 runs laterally around the second opening 23 and projects away from the functional housing 14 at the functional housing connection surface 15. In the exemplary embodiment of the functional housing 14, the sealing socket 35 is rigidly connected to the engagement elements 34, 35 and is formed by these in regions of the engagement elements 34, 36. In the regions of the engagement elements 34, 36, the sealing socket 35 runs on sides of the engagement elements 34, 36 facing away from the second opening 23. In an alternative embodiment, the sealing socket 35 also runs laterally around the engagement elements 34, 36. In this case, the sealing socket 35 is not connected to the engagement elements 34, 36 and is also not formed in sections by these.

The functional module 3 also comprises a cap structure 37 with a hard component 38 and a second soft component 39 arranged on the hard component 38. The hard component 38 comprises a frame 40 surrounding the second opening 23 and at least one plug-in receptacle 41 connected to the frame 40. The second soft component 39 of the cap structure 37 is arranged on a side of the frame 40 facing the functional housing connection surface 15 and runs laterally around the second opening 23. The radial seal 28 is formed by the second soft component 39.

The second soft component 39 may be arranged on the hard component 38 with the aid of a molding process, for example with the aid of injection molding. In this case, the hard component 38 and the second soft component 39 are bonded to each other. However, the second soft component 39 may alternatively also be embodied as an O-ring. However, a material-locking connection between the hard component 38 and the second soft component 39 offers the advantage that the second soft component 39 does not need to be arranged on the hard component 38 when a functional module 3 or the automation platform 1 is mounted.

A plurality of plug-in receptacles 41 may also be provided. Conveniently, the number of plug-in receptacles 41 of the cap structure 37 is identical to the number of engagement elements 34, 36 of the functional housing connection surface 15. For this reason, the cap structure 37 of the exemplary embodiment according to FIG. 5 comprises a further plug-in receptacle 42, which is connected to the frame 40 and is arranged on a side of the frame 40 opposite the plug-in receptacle 41. The plug-in receptacles 41, 42 are embodied to be open on a side facing away from the frame 40, as a result of which plug-in receptacles 41, 42 and the engagement elements 34, 36 may each be used as ventilation nozzles, although this is not absolutely necessary.

When assembling the functional module 3, the functional housing connection surface 15 is arranged on the functional housing 14 in such a way that the functional connection element 21 protrudes from the functional housing 14 through the second opening 23 in the functional housing connection surface 15. As a result, the functional connection element 22 may be guided through a first opening 22 in the base housing connection surface 13 in order to be connected to a base connection element 20.

During assembly of the functional module 3, the plug-in receptacles 41, 42 are plugged onto the functional housing connection surface 15 in such a way that the engagement elements 34, 36 are each pushed into the plug-in receptacles 41, 42 and engage therein. For this reason, the plug-in receptacles 41, 42 comprise similar geometric shapes to the engagement elements 34, 36. A latching hook 43, 44 is arranged on one wall of each of the plug-in receptacles 41, 42. A latching hook 43 of the plug-in receptacle 41 and a further latching hook 44 of the further plug-in receptacle 44 are arranged on facing sides of the plug-in receptacles 41, 42.

A recess 45, 46 is arranged on one wall of each of the engagement elements 34, 36. A recess 45 of the engagement element 34 and a further recess 46 of the further engagement element 36 are arranged on mutually facing sides of the engagement elements 34, 36. If only one engagement element 34 and correspondingly only one plug-in receptacle 41 are provided, the recess 45 and the latching hook 43 are each arranged on a side of the engagement element 34 or the plug-in receptacle 41 facing the second opening 23. The engagement elements 34, 36 are inserted into the plug-in receptacle 41, 42 in such a way that the second soft component 39 rests against an outer wall of the sealing socket 35 and the latching hooks 43, 44 of the plug-in receptacles 41, 42 each engage in a recess 45, 46 of the engagement elements 34, 36.

An edge of the walls of the engagement elements, which in each case delimits the recesses 45, 46, forms a stop 47, 48 in each case on the sides of the recesses 45, 16 facing away from the functional housing connection surface 15.

When the functional module 3 is placed onto the base module 2 and the connecting device 16 between the functional housing 14 and the base housing 12 is open, the second soft component 39 of the cap structure 37 arranges the hard component 38 of the cap structure 38 on the functional housing connection surface 15 in such a way that the latching hooks 43, 44 of the plug-in receptacles 41, 42 each strike against a stop 47, 18 of the engagement elements 34, 36. The latching hook 43 strikes the stop 47. The other latching hook 44 strikes the other stop 48.

Figure 6:
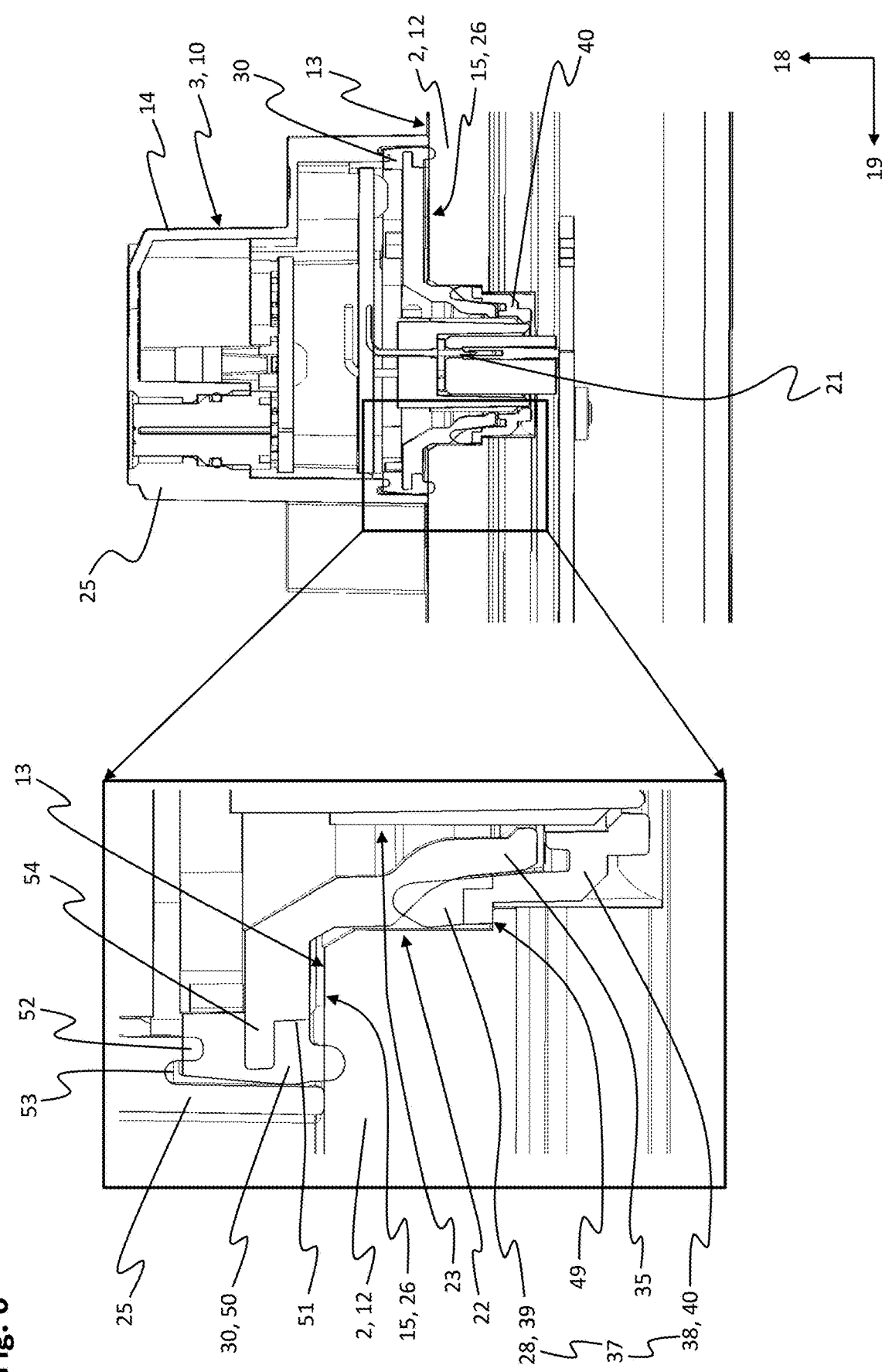
FIG. 6 shows a cross-sectional view of the functional module of FIG. 5.

FIG. 6 shows a schematic cross-sectional view of the automation platform 1 as shown in FIG. 3, although only the fourth functional module 10 and the base module 2 are shown. The fourth functional module 10 is shown in more detail in FIG. 6 than in FIG. 3. FIG. 6 only shows the fourth functional module 10 as an example in order to explain the principle of the radial seals 28 of the automation platform 1 in more detail. However, the automation platform 1 comprises at least one such radial seal 28 for each other functional module 10, which is arranged between the base module 2 and the functional module 3. FIG. 6 also shows an enlargement in the area of the radial seal 28. Identical elements are marked by the same reference numerals as in the previously explained drawings.

In the base housing connection surface 13, a projection 49 is formed around the first opening 22. The projection 49 is arranged on a side of the base housing connection surface 13 facing the interior of the base housing 12. The projection 49 may also be referred to as a seat. When the functional module 3 is placed onto the base module 2, with the connecting device 16 open, the cap structure 37 engages in the first opening 22 in the base housing connection surface 13 in such a way that the frame 40 of the hard component 38 of the cap structure 37 rests on the projection 49 in the base housing connection surface 13 and the outer wall of the sealing socket 35 is supported on the second soft component 39 of the cap structure 37 in such a way that the functional housing connection surface 15 is spaced apart from the base housing connection surface 13.

Figure 7:
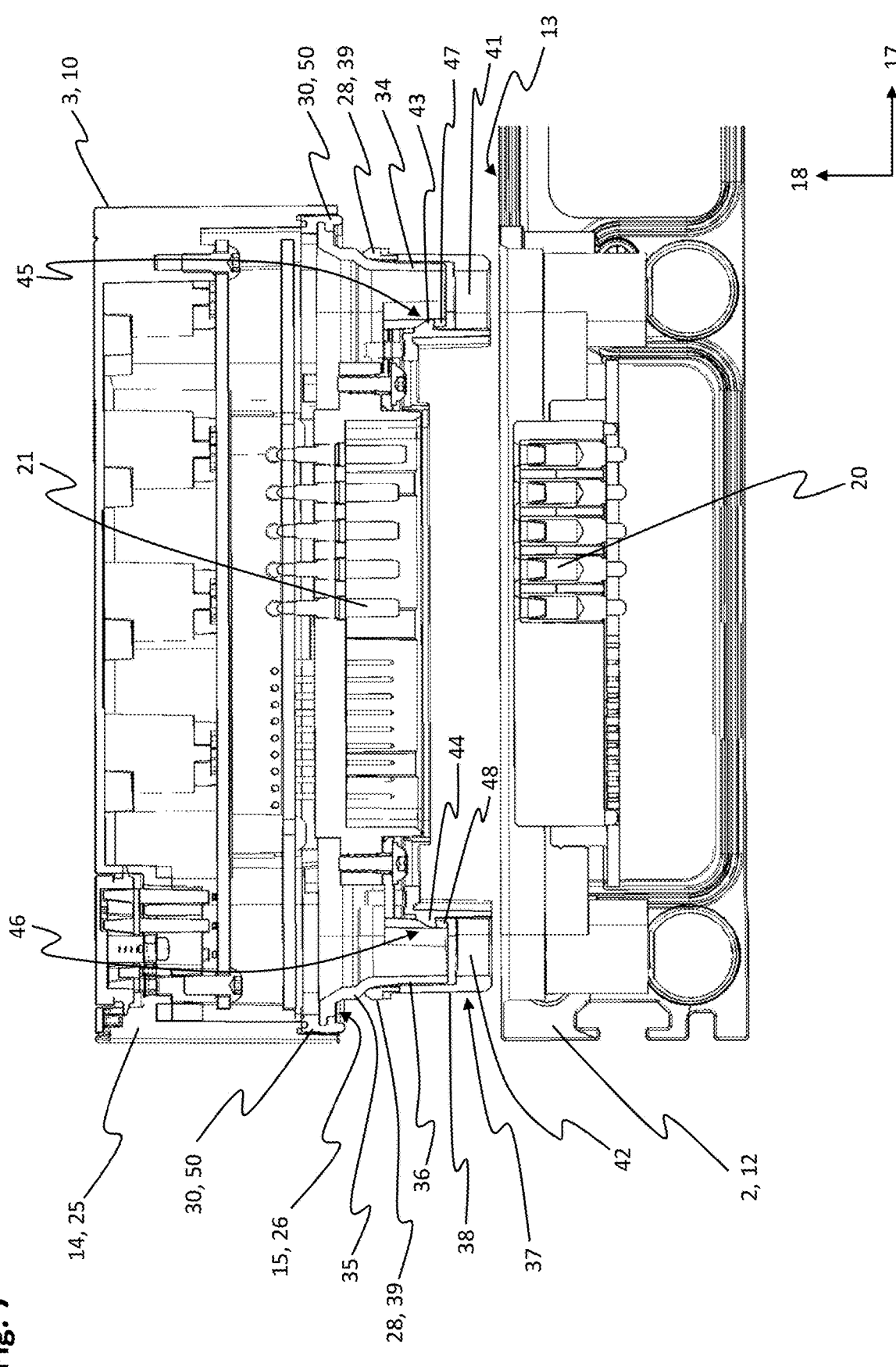
FIG. 7 shows a cross-sectional view of a functional module and a base module in an unassembled state of the automation platform.
Figure 8:
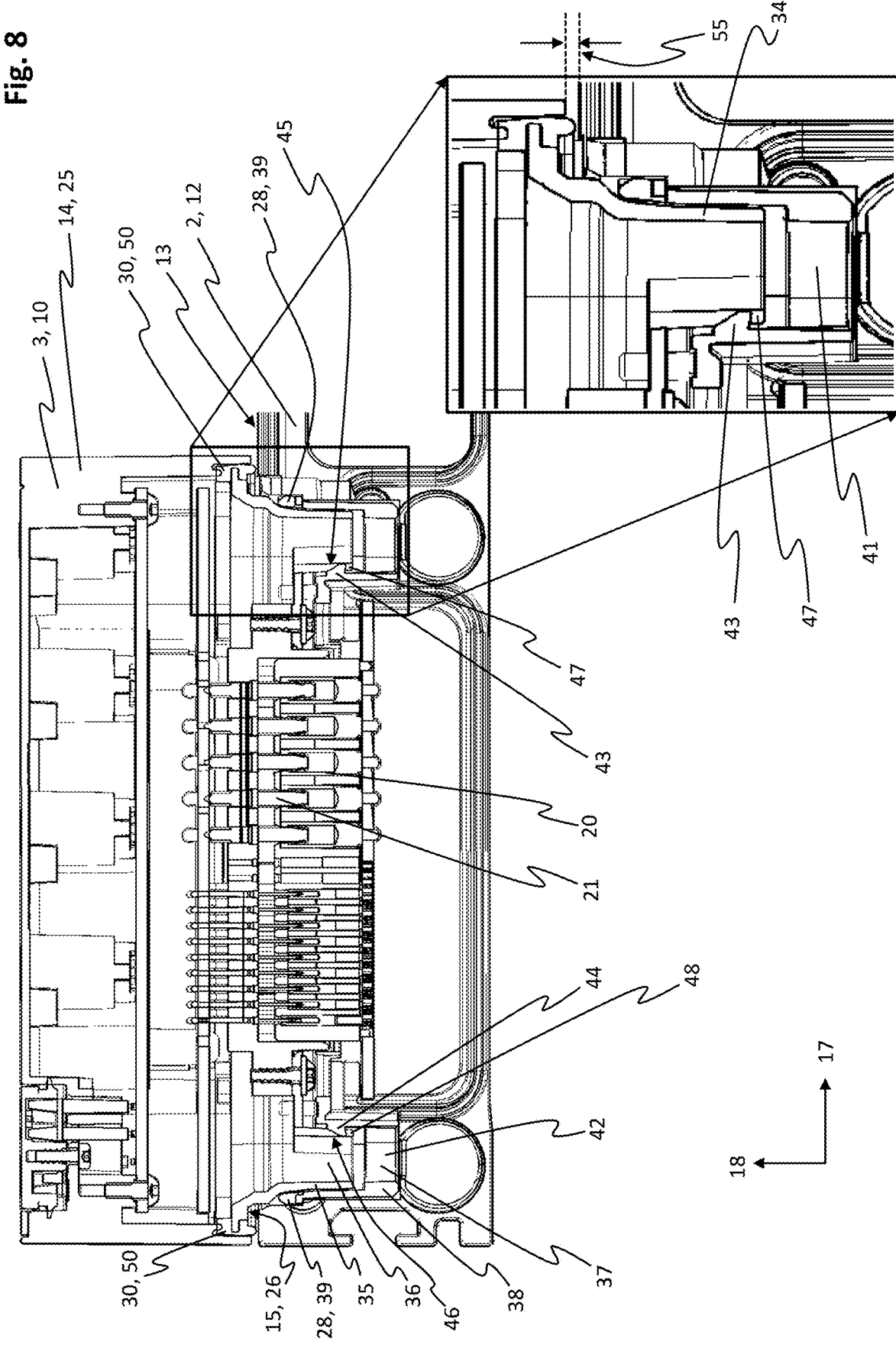
FIG. 8 shows the cross-sectional view of FIG. 7, with the functional module mounted onto the base module.
Figure 9:
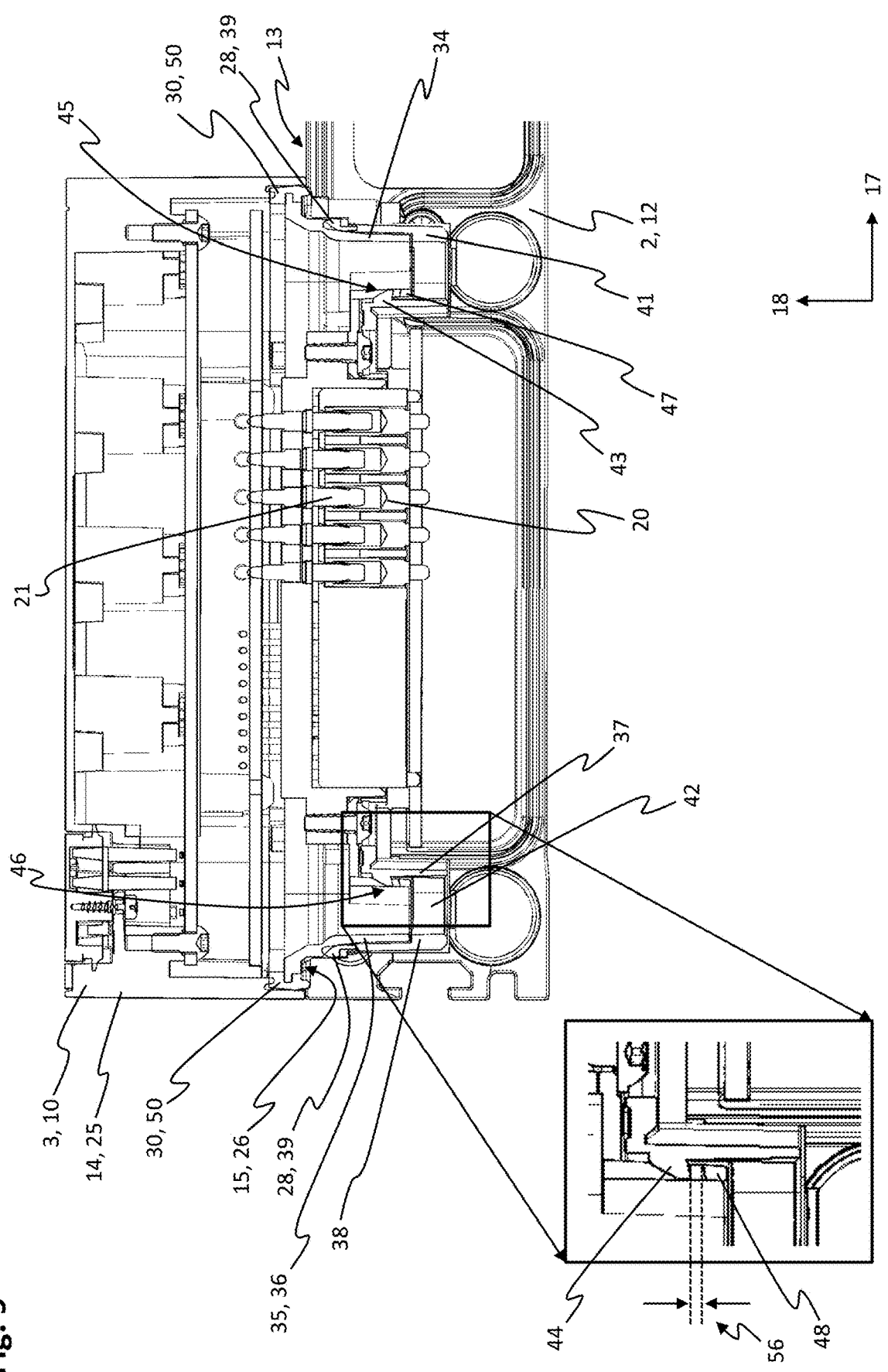
FIG. 9 shows the cross-sectional view of FIG. 8, with the functional module pressed onto the base module.

In this case the automation platform 1 is shown in the assembled state, with the connecting device 16 closed. A distance between the base housing connection surface 13 and the functional housing connection surface 15 when the functional module 3 is mounted on the base module 2 and the connecting device 16 is open may also be referred to as a stroke. The stroke and its effect are explained in more detail in the description of the method for assembling the automation platform 1 as shown in FIGS. 7 to 9. If a slot is to be sealed with a plug 57, the projection 49 may serve as a stop or as a depth limit for the plug 57.

When the connecting device 16 is closed as shown in FIG. 6, the functional housing connection surface 15 is pressed against the base housing connection surface 13 in such a way that the second soft component 39 of the cap structure 37 is radially pressed in areas between the projection 49 in the base housing connection surface 13 and the outer wall of the sealing socket 35, and the engagement elements 34, 36 of the functional housing connection surface 15 are each inserted into the plug-in receptacles 41, 42 of the hard component 38 of the cap structure 37 in such a way that the latching hooks 43, 44 of the plug-in receptacles 41, 42 are each spaced apart from the stop 47, 48 of the engagement elements 34, 36.

The second soft component 39 lies against the sealing socket 35, forming a first radial barrier against dust, moisture or chemicals. As in the exemplary embodiment of FIG. 6, the sealing socket 35 may be embodied to taper at least in sections from the functional housing connection surface 15. The second soft component 39 of the cap structure 37 lies against the outer wall of the sealing socket 35 in the area of the tapered section. This allows for the second soft component 39 to be pressed more efficiently. In addition, the second soft component 39 rests over the projection 39 against a wall that delimits the first opening 22 in the base housing connection surface 13. This forms a second radial barrier. FIG. 6 shows the second seal 28 in both a compressed and an uncompressed state in order to illustrate the sealing effect. In FIG. 6, a section of the second soft component 39 overlapping with the sealing socket 35 indicates a geometry of the second soft component 39 in the uncompressed state. In the compressed state, the second soft component 39 extends only as far as the sealing socket 35.

In the fourth functional module 10, the functional housing connection surface 15 is embodied as a separate base plate 26. For this reason, a second axial seal 30 is provided. A third soft component 50 is arranged between the functional housing connection surface 15 and side walls 25 of the functional housing 14. The third soft component 50 may, for example, be arranged on an edge 51 of the functional housing connection surface 15 with the aid of a molding process, for example with the aid of an injection molding process. As an alternative, the third soft component 50 may be attached to the edge 51 of the functional housing connection surface 15.

When the fourth functional module 10 is placed onto the base module 2, with the connecting device 16 open, the third soft component 50 is arranged on the base housing connection surface 13 and pressed against the base housing connection surface 13 when the connecting device 16 is closed. This forms a second axial barrier against dust, moisture or chemicals. In addition, the third soft component 50 lies against the side walls 25 of the functional housing 14, forming a third radial barrier.

According to the exemplary embodiment of the fourth functional module 10, the side walls 25 of the functional housing 14 comprise a further projection 52 on an inner side of the functional housing 14. As an example, a groove-shaped recess 53 is formed between the further projection 52 and the side walls 25, however, this may also be omitted. When the fourth functional module 10 is placed onto the base module 2, with the connecting device 16 open, the third soft component 50 rests against the further projection 52. When the connecting device 16 is closed, the third soft component 50 is pressed against the further projection 52. This forms a third axial barrier. However, the further projection 52 does not necessarily have to be provided and may also be omitted. The third soft component 50 is also shown in FIG. 6 in a compressed as well as in an uncompressed state in order to illustrate the sealing effect. A section of the third soft component 50 overlapping with the projection 52 in FIG. 6 indicates the uncompressed state.

The functional housing connection surface 15 also comprises an additional projection 54 protruding in the direction of the side walls 25 of the functional housing 14. The additional projection 54 is embedded in the third soft component 50. When the fourth functional module 10 is placed onto the base module 2, with the connecting device 16 open, the third soft component 50 rests against the additional projection 54. When the connecting device 16 is closed, the third soft component 50 is pressed against additional projection 54. This forms a fourth axial barrier and a fifth axial barrier. The fourth axial barrier is formed on a side of the functional housing connection surface 15 facing away from the base housing connection surface 13. The fifth axial barrier is formed on a side of the functional housing connection surface 15 facing the base housing connection surface 13. In addition, a third radial barrier is formed in an area where the third soft component 50 is pressed against the edge 51 of the functional housing connection surface 15 when the functional housing connection surface 15 is connected to the side walls 25 of the functional housing.

FIGS. 7 to 9 schematically show successive states in the context of a process for assembling the automation platform 1, in each case corresponding to the cross-sectional view of FIG. 2. The fourth functional module 10 is shown only as an example in order to explain the effect of the radial seal 28 during assembly.

FIG. 7 shows a state in which the functional module 3 and the base module 3 are separated from each other. In this case, the second soft component 39 of the cap structure 37 arranges the hard component 38 of the cap structure 37 on the functional housing connection surface 15 in such a way that the latching hooks 43, 44 of the plug-in receptacles 41, 42 each strike against the stop 47, 48 of the engagement elements 34, 36.

FIG. 8 shows a state subsequent to FIG. 7 after the functional module 3 has been placed onto the base module 2. However, the connecting device 16 is in an open state. The functional module 3 is therefore only in contact with the base module 2 and is not yet pressed onto the base module 2.

In this case too, the second soft component 39 of the cap structure 37 arranges the hard component 38 of the cap structure 37 on the functional housing connection surface 15 in such a way that the latching hooks 43, 44 of the plug-in receptacles 41, 42 each strike against the stop 47, 48 of the engagement elements 34, 36. This is due to the fact that the second soft component 39 is not yet pressed, as the connecting device 16 is open.

The cap structure 37 engages the first opening 22 in the base housing connection surface 13 in such a way that the frame 40 of the hard component 38 of the cap structure 37 rests on the projection 49 in the base housing connection surface 13 and the outer walls of the sealing socket 35 are supported on the second soft component 39 of the cap structure 37 in such a way that the functional housing mating surface 15 is spaced apart from the base housing connection surface 13. This distance may also be referred to as the stroke 55.

FIG. 8 also shows an enlargement of an area of the latching hook 43 that rests against the stop 47. The enlargement also shows the stroke 55 between the base housing connection surface 13 and the functional housing connection surface 15. The stroke 55 is also a result of the fact that the second soft component 39 is not yet pressed in this state.

As a result, the second soft component 39 remains in an unpressed state during the insertion or positioning of the functional module 3, so that the functional module 3 may be positioned almost frictionlessly and thus without force.

FIG. 9 shows a state subsequent in time to FIG. 8 after the connecting device 16 has been closed, wherein the functional module 3 has been connected to the base module 2. As in FIG. 6, FIG. 9 also shows the second seal 28 in the compressed and uncompressed state, which is why the section of the second soft component 39 overlapping with the sealing socket 35 is also shown in FIG. 9 and indicates the geometry of the second soft component 39 in the uncompressed state.

By closing the connecting device 16, the functional housing connection surface 15 was pressed against the base housing connection surface 13 in such a way that the second soft component 39 of the cap structure 37 was radially pressed in areas between the projection 49 in the base housing connection surface 13 and the outer wall of the sealing socket 35. The engagement elements 34, 36 of the functional housing connection surface 15 were inserted into the plug-in receptacles 41, 42 of the hard component 38 of the cap structure 37 in such a way that the latching hooks 43, 44 of the plug-in receptacles 41, 42 are each spaced apart from the stops 47, 48 of the engagement elements 34, 36.

FIG. 9 shows an enlargement in the area of one of the latching hooks 44 and a distance 56 to the relevant stop 48. The functional module 3 is therefore only pulled to the end position by the connecting device 16 shortly before the functional housing connection surface 15 makes contact with the base housing connection surface 13. Only then does the radial seal 28 create a sealing effect, allowing the functional module 3 to be fitted with little effort. This may simplify the insertion or attachment of particularly large functional modules 3 with a number of functional connection elements 21 and radial seals 28. In addition, there is less wear on the radial seal 28 during assembly.

If the connecting device 16 is opened or released again, the second soft component 39 presses against the outer wall of the sealing socket 35 in such a way that the functional housing connection surface 15 is spaced apart from the base housing connection surface 13 and the latching hooks 43, 44 rest against the stops 47, 48 of the engagement elements 34, 36. When a pressure generated by the connecting device 16 on the second soft component is removed, the second soft component 39 thus presses the functional housing 14 into the unmounted state and there is no longer any great friction between the functional module 3 and the base module 2.

When the connecting device 16 is released, the second soft component 39 already presses against the functional module 3 with a force component, so that the release of the functional module is supported and may take place with little force. Only then may the cap structure 37 be taken along via the locking hooks 43, 44. The functional module 3 may therefore be detached from the base module 2 more easily by the stroke 55, in that the functional module 3 may already be pulled off in accordance with the stroke 55, but the cap structure 37 initially remains in position, as the latching hooks 43, 44 are initially spaced apart from the stops 47, 48.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

TABLE 1

| List of reference numerals | |
| --- | --- |
| 1 | Automation platform |
| 2 | Base module |
| 3 | Functional module |
| 4 | First functional module |
| 5 | Second functional module |
| 6 | Voltage Connection |
| 7 | Main switch |
| 8 | Third functional module |
| 9 | Data connection |
| 10 | Fourth functional module |
| 11 | Analog and/or digital data connections |
| 12 | Base housing |
| 13 | Base housing connection surface |
| 14 | Functional housing |
| 15 | Functional housing connection surface |
| 16 | Connecting device |
| 17 | First direction |

TABLE 1-continued

List of reference numerals

| | |
|---|---|
| 18 | Second direction |
| 19 | Third direction |
| 20 | Basic connection element |
| 21 | Functional connection element |
| 22 | First opening in base housing |
| 23 | Second opening in functional housing |
| 24 | Circuit board |
| 25 | Side walls of functional housing |
| 26 | Base plate of functional module |
| 27 | Cap of functional housing |
| 28 | Radial seal |
| 29 | First axial seal |
| 30 | Second axial seal |
| 31 | First soft component |
| 32 | Groove on functional housing connection surface |
| 33 | Retaining nubs of first soft component |
| 34 | Engagement element of functional housing connection surface |
| 35 | Sealing socket of functional housing connection surface |
| 36 | Further engagement element of functional housing connection surface |
| 37 | Cap structure of functional module |
| 38 | Hard component of cap structure |
| 39 | Second soft component of cap structure |
| 40 | Frame of the cap structure |
| 41 | Plug-in receptacle |
| 42 | Further plug-in receptacle |
| 43 | Locking hook of the plug-in receptacle |
| 44 | Additional latching hook of additional plug-in receptacle |
| 45 | Recess in engagement element |
| 46 | Further recess in further engagement element |
| 47 | Stop |
| 48 | Further stop |
| 49 | Projection in base housing connection surface |
| 50 | Third soft component |
| 51 | Edge of functional housing connection surface |
| 52 | Further projection on side walls of functional housing |
| 53 | Groove-shaped recess between further projection and side walls of functional housing |
| 54 | Additional advantage in functional housing connection surface |
| 55 | Stroke between base housing connection surface and functional housing connection surface |
| 56 | Distance between latching hook and stop |
| 57 | Stopper |

What is claimed is:

1. An automation platform having:

a base module, at least one functional module and at least one connecting device for connecting the base module and the functional module, wherein the base module comprises a base housing having a base housing connection surface, wherein the base housing connection surface comprises at least one first opening, wherein a projection running around the first opening is configured in the base housing connection surface, wherein the functional module comprises a functional housing having a functional housing connection surface, wherein the functional housing connection surface comprises at least one second opening, at least one engagement element arranged at the second opening and a sealing socket running around the second opening, wherein a wall of the engagement element comprises a recess, wherein an edge of the wall of the engagement element delimiting the recess forms a stop on a side of the recess facing away from the functional housing connection surface, wherein the functional module comprises a cap structure having a hard component and a soft component arranged on the hard component, wherein the hard component comprises a frame running around the second opening and at least one plug-in receptacle connected to the frame, wherein the soft component of the cap structure is arranged on a side of the frame facing the functional housing connection surface and runs laterally around the second opening, wherein a latching hook is arranged at a wall of the plug-in receptacle, wherein the engagement element is inserted into the plug-in receptacle in such a way that the soft component bears against an outer wall of the sealing socket and the latching hook engages in the recess, wherein, when the functional module is placed onto the base module, with the connecting device open, the soft component of the cap structure arranges the hard component of the cap structure at the functional housing connection surface in such a way that the latching hook of the plug-in receptacle abuts on the stop of the engagement element, the cap structure engages in the first opening in the base housing connection surface in such a way that the frame of the hard component of the cap structure rests on the projection in the base housing connection surface and the outer wall of the sealing socket is supported on the soft component of the cap structure in such a way that the functional housing connection surface is spaced apart from the base housing connection surface and, when the connecting device is closed, the functional housing connecting surface is pressed against the base housing connecting surface in such a way that the soft component of the cap structure is radially pressed in regions between the projection in the base housing connection surface and the outer wall of the sealing socket and the engagement element of the functional housing connection surface is inserted into the plug-in receptacle of the hard component of the cap structure in such a way that the latching hook of the plug-in receptacle is spaced apart from the stop of the engagement element.

2. The automation platform according to claim 1, wherein the functional housing connection surface comprises at least one further engagement element arranged opposite to the second opening and to the engagement element, wherein a wall of the further engagement element comprises a further recess, wherein a further edge of the wall of the further engagement element delimiting the further recess forms a further stop on a side of the further recess facing away from the functional housing connection surface, wherein the hard component comprises at least one further plug-in receptacle connected to the frame, wherein a further latching hook is arranged at a wall of the further plug-in receptacle, wherein the further engagement element is inserted into the further plug-in receptacle in such a way that the soft component abuts on an outer wall of the sealing socket and the further latching hook engages in the further recess, wherein, when the functional module is placed onto the base module, with the connecting device open, the soft component of the cap structure arranges the hard component of the cap structure on the functional housing connection surface in such a way that the further latching hook of the further plug-in receptacle abuts on the further stop of the further engagement element, wherein, when the connecting device is closed, the further engagement element of the functional housing connection surface is inserted into the further plug-in receptacle of the hard component of the cap structure in such a way that the further latching hook of the further plug-in receptacle is spaced apart from the further stop of the further engagement element.

3. The automation platform according to claim 1, wherein the sealing socket is configured to taper at least in sections originating from the functional housing connection surface, wherein the soft component of the cap structure abuts on the outer wall of the sealing socket in the region of the tapered section.

4. The automation platform according to claim 1, wherein the sealing socket is connected to the engagement element and is formed in the region of the engagement element by the latter or runs laterally around the engagement element.

5. The automation platform according to claim 1, wherein an additional soft component is arranged between the functional housing connection surface and side walls of the functional housing, wherein, when the functional module is placed onto the base module, the additional soft component is arranged on the base housing connection surface when the connecting device is open and is pressed against the base housing connection surface when the connecting device is closed.

6. The automation platform according to claim 5, wherein the side walls of the functional housing comprise a further projection on an inner side of the functional housing, wherein, when the functional module is placed onto the base module, the additional soft component rests against the further projection when the connecting device is open and is pressed against the further projection when the connecting device is closed.

7. The automation platform according to claim 5, wherein the functional housing connection surface comprises an additional projection protruding in the direction of the side walls of the functional housing, wherein the additional projection is embedded in the additional soft component, wherein, when the functional module is placed onto the base module, the additional soft component rests against the additional projection when the connecting device is open and is pressed against the additional projection when the connecting device is closed.

8. The automation platform according to claim 1, wherein the functional housing connection surface is rigidly connected to side walls of the functional housing, wherein a further soft component is arranged in a groove formed on the functional housing connection surface, wherein, when the functional module is placed onto the base module, the further soft component is arranged on the base housing connection surface when the connecting device is open and is pressed against the base housing connection surface when the connecting device is closed.

9. A functional module, comprising a functional housing with a functional housing connection surface, wherein the functional housing connection surface comprises at least one second opening, at least one engagement element arranged at the second opening and a sealing socket running around the second opening, wherein a wall of the engagement element comprises a recess, wherein an edge of the wall of the engagement element delimiting the recess forms a stop on a side of the recess facing away from the functional housing connection surface, wherein the functional module comprises a cap structure with a hard component and a soft component arranged on the hard component, wherein the hard component comprises a frame running around the second opening and at least one plug-in receptacle connected to the frame, wherein the soft component of the cap structure is arranged on a side of the frame facing the functional housing connection surface and runs laterally around the second opening, wherein a latching hook is arranged on a wall of the plug-in receptacle, wherein the engagement element is inserted into the plug-in receptacle in such a way that the soft component rests against an outer wall of the sealing socket and the latching hook engages in the recess, wherein the soft component of the cap structure arranges the hard component of the cap structure at the functional housing connection surface in such a way that the latching hook of the plug-in receptacle abuts on the stop of the engagement element, wherein the functional module is configured to be placed onto a base module in such a way that, when the connecting device is open, the cap structure engages in a first opening in a base housing connection surface, that the frame of the hard component of the cap structure rests on the projection in the base housing connection surface and the outer wall of the sealing socket is supported on the soft component of the cap structure in such a way that the functional housing connection surface is spaced apart from the base housing connection surface and, when the connecting device is closed, the functional housing connecting surface is pressed against the base housing connecting surface in such a way that the soft component of the cap structure is radially pressed in regions between the projection in the base housing connection surface and the outer wall of the sealing socket and the engagement element of the functional housing connection surface is pushed into the plug-in receptacle of the hard component of the cap structure in such a way that the latching hook of the plug-in receptacle is spaced apart from the stop of the engagement element.

10. The functional module according to claim 9, wherein the functional housing connection surface comprises at least one further engagement element arranged opposite the second opening and the engagement element, wherein a wall of the further engagement element comprises a further recess, wherein a further edge of the wall of the further engagement element delimiting the further recess forms a further stop on a side of the further recess facing away from the functional housing connection surface, wherein the hard component comprises at least one further plug-in receptacle connected to the frame, wherein a further latching hook is arranged on a wall of the further plug-in receptacle, wherein the further engagement element is inserted into the further plug-in receptacle in such a way that the soft component rests against an outer wall of the sealing socket and the further latching hook engages in the further recess, wherein the soft component of the cap structure arranges the hard component of the cap structure on the functional housing connection surface in such a way that the further latching hook of the further plug-in receptacle abuts on the further stop of the further engagement element, wherein, when the connecting device is closed, the further engagement element of the functional housing connection surface is inserted into the further plug-in receptacle of the hard component of the cap structure in such a way that the further latching hook of the further plug-in receptacle is spaced apart from the further stop of the further engagement element.

11. The functional module according to claim 9, wherein the sealing socket is configured to taper at least in sections originating from the functional housing connection surface, wherein the soft component of the cap structure bears against the outer wall of the sealing socket in the region of the tapering section.

12. The functional module according to claim 9, wherein the sealing socket is connected to the engagement element and is formed in the region of the engagement element by the latter or laterally runs around the engagement element.

13. The functional module according to 9, wherein an additional soft component is arranged between the functional housing connection surface and side walls of the functional housing, wherein, when the functional module is placed onto the base module, the additional soft component is arranged on the base housing connection surface when the connecting device is open and is pressed against the base housing connection surface when the connecting device is closed.

14. The functional module according to claim 13, wherein the side walls of the functional housing comprise a further projection at an inner side of the functional housing, wherein, when the functional module is placed onto the base module, the additional soft component rests against the further projection when the connecting device is open and is pressed against the further projection when the connecting device is closed.

15. The functional module according to claim 13, wherein the functional housing connection surface comprises an additional projection protruding towards the side walls of the functional housing, wherein the additional projection is embedded in the additional soft component.

16. The functional module according to claim 9, wherein the functional housing connection surface is rigidly connected to side walls of the functional housing, wherein a further soft component is arranged in a groove formed on the functional housing connection surface, wherein, when the functional module is placed onto the base module, the further soft component is arranged on the base housing connection surface when the connecting device is open and is pressed against the base housing connection surface when the connecting device is closed.

17. A method for assembling an automation platform comprising the following method steps:

placing a functional module onto a base module in such a way that a cap structure engages in a first opening in a base housing connection surface, that a frame of a hard component of the cap structure rests on a projection in the base housing connection surface an outer wall of a sealing socket are supported on a soft component of the cap structure in such a way that a functional housing connection surface is spaced apart from the base housing connection surface, closing a connecting device, wherein the functional housing connection surface is pressed against the base housing connection surface in such a way that the soft component of the cap structure is radially pressed in regions between the projection in the base housing connection surface and the outer wall of the sealing socket, and an engagement element of the functional housing connection surface is inserted into a plug-in receptacle of the hard component of the cap structure in such a way that a latching hook of the plug-in receptacle is spaced apart from a stop of the engagement element.

18. The method according to claim 17 comprising the following further method step:

releasing the connecting device, as a result of which the soft component presses against the outer wall of the sealing socket in such a way that the functional housing connection surface is spaced apart from the base housing connection surface and the latching hook rests against the stop of the engagement element.

\* \* \* \* \*